United States Patent

Guo et al.

[11] Patent Number: 5,944,899
[45] Date of Patent: Aug. 31, 1999

[54] INDUCTIVELY COUPLED PLASMA PROCESSING CHAMBER

[75] Inventors: Xin Sheng Guo, Los Altos Hills; Virendra V. S. Rana, Los Gatos, both of Calif.

[73] Assignee: Applied Materials, Inc., Santa Clara, Calif.

[21] Appl. No.: 08/701,287

[22] Filed: Aug. 22, 1996

[51] Int. Cl.⁶ ..................................................... C23C 16/00
[52] U.S. Cl. ........................ 118/715; 118/723 I; 156/345
[58] Field of Search ............. 118/723 I, 723 IR, 118/723 AN, 715, 723 R; 156/345; 315/111.51

[56] References Cited

U.S. PATENT DOCUMENTS

| | | | |
|---|---|---|---|
| 5,681,418 | 10/1997 | Ishimaru | 156/345 |
| 5,688,357 | 11/1997 | Hanawa | 156/345 |
| 5,688,358 | 11/1997 | Tanaka et al. | 156/345 |
| 5,753,044 | 5/1998 | Hanawa et al. | 118/723 I |
| 5,777,289 | 7/1998 | Hanawa et al. | 219/121.43 |

*Primary Examiner*—Bruce Breneman
*Assistant Examiner*—Luz Alejandro
*Attorney, Agent, or Firm*—Patterson & Associates

[57] ABSTRACT

An apparatus and method are provided for an inductively coupled plasma within a reactor for processing semiconductor wafers or workpieces. A gas distribution system having an annular passage formed between the chamber walls and quartz dome uniformly inlet gases over the wafer. The system of the present invention provides an increased etch rate with high selectively and anistropy.

18 Claims, 2 Drawing Sheets

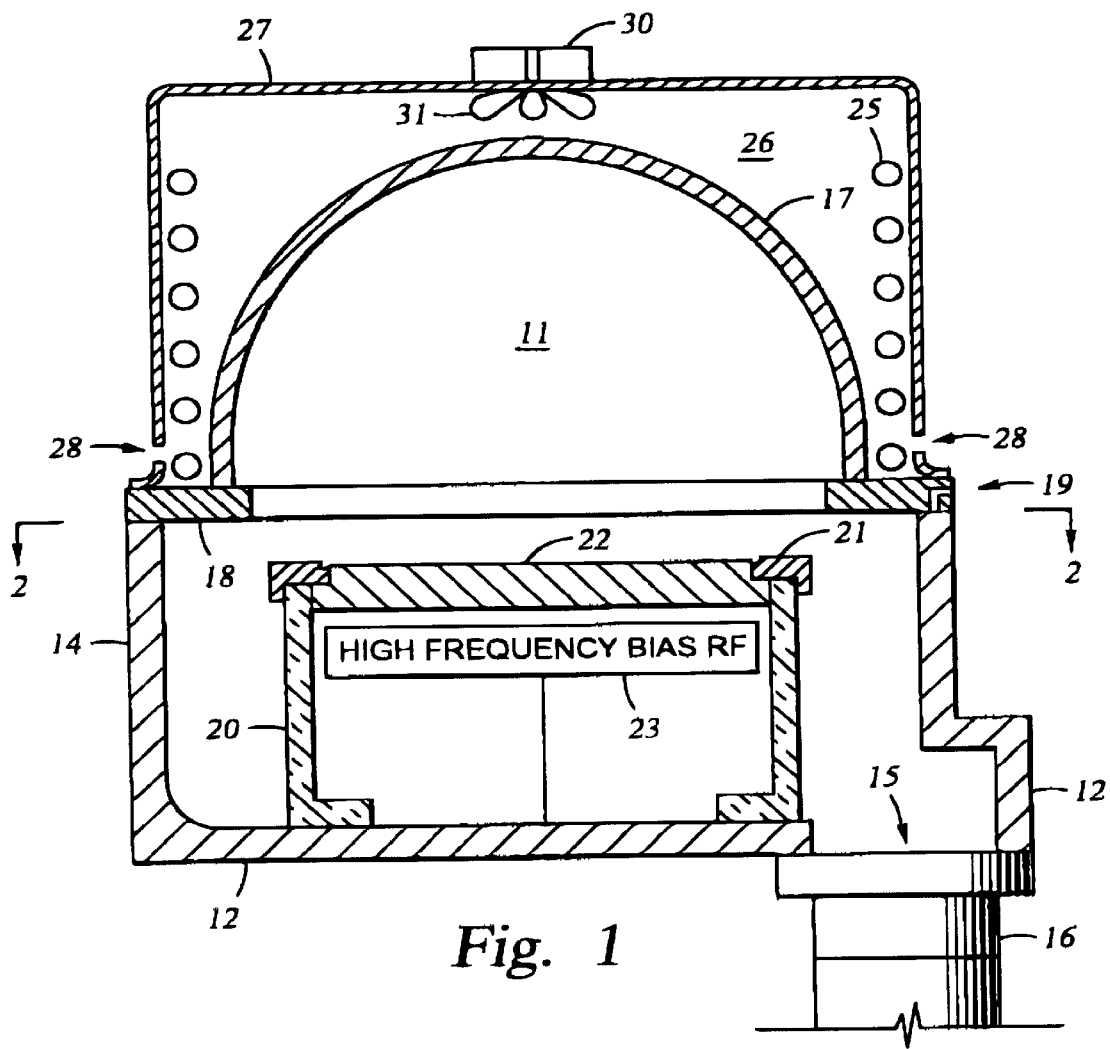
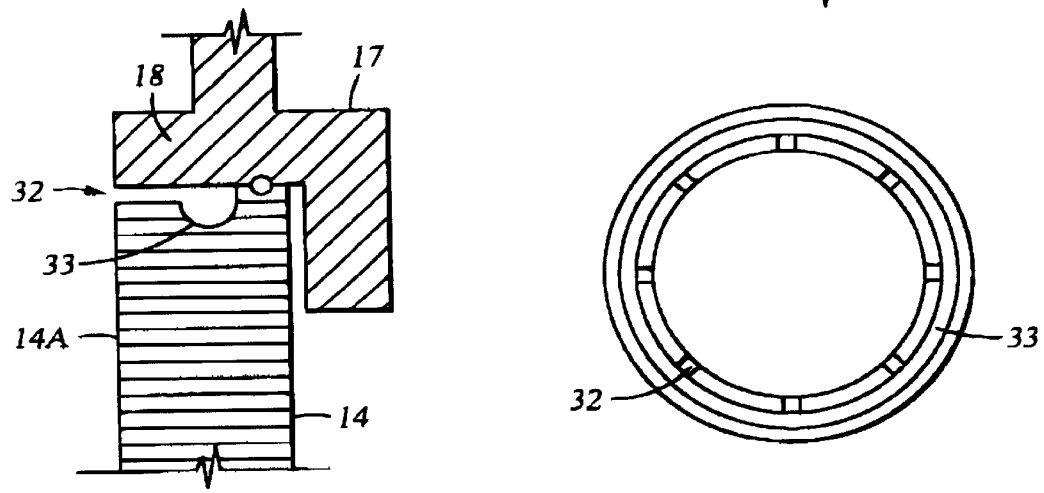
Fig. 1
Fig. 3   Fig. 2 ically coupled plasma to drive the process and reactor. The
INDUCTIVELY COUPLED PLASMA PROCESSING CHAMBER

BACKGROUND OF THE INVENTION

1. Field of the Invention

The present invention relates to inductively coupled plasma reactors for plasma processing, such as semiconductor wafer processing. More particularly, the invention relates to RF powered plasma etching, chemical vapor deposition, or plasma emission ion implantation using a vacuum chamber and an inductively coupled plasma.

2. Background of the Related Art

The fabrication of multiple layer semiconductor structures typically requires the selective etching of one material faster than another. If each layer can also contain three dimensional characteristics (i.e., a vertical etch profile), then anisotropic etching can be required. A sub-half micron polysilicon gate structure can, for example, require a vertical etch profile and an etching selectivity ratio of polysilicon to $SiO_2$ of 50 or 100. Reactive chemical species of ions can provide high selectivity, but generally provide poor etch anisotropy. On the other hand, high energy ions can provide good anisotropy, but relatively poor selectivity. Extremely high selectivity and anisotropy in a plasma etch system require high density ions with very well controlled energy distribution. This has led to the development of high density plasma reactors.

For example, U.S. Pat. No. 5,540,800 issued on Jul. 30, 1996 and which is assigned to the assignee of the present invention, shows a high density plasma reactor having an RF inductively coupled plasma generator employing a transformer isolating RF antenna. While this design has proven very useful, the present invention is an improvement in operation over this design and is itself a simplified design.

In sputter etch processes, a gas such as argon is typically introduced into a chamber and a negative bias is capacitively coupled to a substrate or workpiece. The chamber walls are grounded and a plasma is struck in the space between the substrate and the chamber lid. The negative bias attracts the ions in the plasma causing a cascade of collisions of the ions with the substrate surface. As the ions collide with the substrate, material deposited on the surface of the substrate, such as SiO2, will be ejected or sputtered from the surface and deposit on the other chamber components or be exhausted from the chamber. This arrangement requires that a plasma be capacitively coupled within the chamber by placing the negative potential on the substrate and grounding the chamber walls. Capacitive sputter etching of substrate surfaces is a slow and inefficient process.

Therefore, there remains a need for an etchback process which is faster than capacitively coupled plasma process.

SUMMARY OF THE INVENTION

The present invention overcomes the shortcomings of prior art plasma chambers and uses an inductively coupled high density plasma to drive the process and reactor. The reactor includes a vacuum chamber for holding a wafer to be processed in the interior thereof and has a separate quartz dome capable of containing a plasma gas. An outer cover supports an RF antenna or coil which inductively couples RF power into the chamber. The RF antenna or induction coil is wound exteriorly of the quartz dome and is connected to an RF power source for generating the plasma in the chamber. A reactant gas supply and pumping system supply the desired reactant gas and maintain its presence in a reduced pressure atmosphere of from about 0.1 to about 10 millitorr. A gas distribution system is formed approximately at mid-chamber, by a circumferential groove milled into the outer wall of the chamber body and a top of which is formed by a circumferential flange in the quartz dome itself. A circumferential distribution of the reactant gas at approximately mid-chamber provides uniform gas distribution over the surface of the workpiece. This, in turn, increases ion density at the work surface for faster etching. The system also includes a processing pedestal which does not use a magnetic field to enhance ion density at the work surface, and which is more easily temperature controlled. An RF bias supply is efficiently coupled to the pedestal and used to establish a negative bias on the workpiece or cathode and the system by capacitive coupling. Coolant fluid is pumped through the pedestal to control the wafer temperature during processing. The annular space between the quartz dome and the outer top cover is vented with a fan located in the upper portion of the cover to effect cooling of the surfaces in contact therewith.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 1 is a schematic cross-sectional view showing the overall layout of the inductively coupled plasma reactor of the invention;

FIG. 2 is a schematic top view in section along lines 2—2 of FIG. 1 showing the gas distribution system;

FIG. 3 is a schematic enlarged view showing in section a portion of the gas distribution system;

DESCRIPTION OF THE PREFERRED EMBODIMENT

Figure 4:
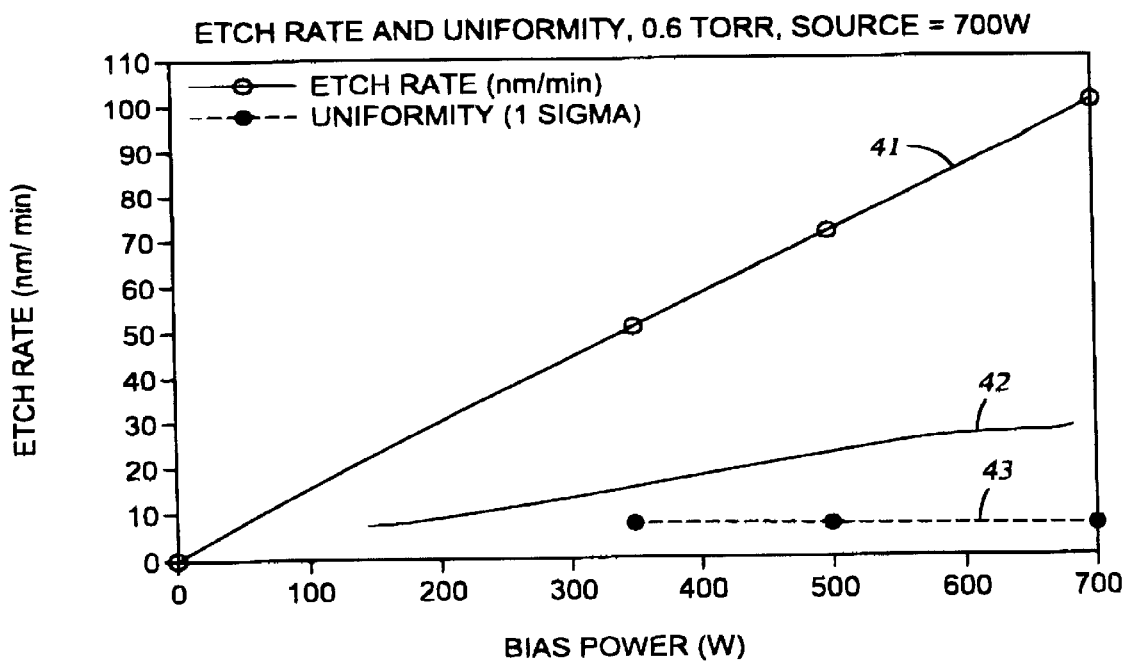
FIG. 4 is a graphical representation showing the etch rate and its uniformity as a function of bias power applied to the pedestal of the system.

Referring now to FIG. 1, the processing system of the invention is shown schematically in a sectional view. A vacuum chamber 11 is formed by a base member 12 having sidewalls 14 and which are preferably made of metallic construction such as stainless steel, aluminum or the like. An exhaust channel 15 in the base of the body member 12 is connected to a turbo pump 16 which is used to control the gas pressure inside the chamber 11 and to exhaust gases out of the chamber. A quartz dome 17 forms the top of the chamber 11 and is provided with a flange 18 about its circumference where it mates with the top circumference of the sidewalls 14 of base member 12. The bottom of dome 17 is of smaller diameter than the walls 14, thereby spacing the walls 14 farther from a plasma and the substrate supported in the chamber. A gas distribution system 19 is provided at the juncture of the quartz dome 17 and base member 12 which will be discussed in more detail below. An insulating pedestal 20 made of quartz, ceramic or the like has a quartz cover 21 surrounding a conductive pedestal 22 which is arranged to hold a wafer or workpiece in the chamber 11. The pedestal 20 has water coolant coils (not shown) wound interiorly therein for temperature control of the workpiece which is placed on the conductive portion 22 of the pedestal. A high frequency RF power supply 23 is capacitively coupled to the pedestal 22 and supplies a negative bias voltage thereto. This bias voltage is coupled to the workpiece via a workpiece holder which may be of the type known as an electrostatic chuck.

A helical shaped RF induction coil 25 is wound exteriorly to quartz dome 17 and is supported by the cover 27. The coil 25 is supported on the cover 27 by insulators to isolate the coil from the cover 27. An alternating axial electromagnetic field is produced in the chamber 11 interiorly to the windings of the coil 25. Generally, an RF frequency of from about 400 KHz to about 450 KHz is employed and an RF power supply of conventional design (not shown) operating at this frequency is coupled to the coil 25 by a matching network (not shown) to generate a plasma in the chamber 11. The RF electromagnetic field generates a glow discharge plasma within the portion of the chamber 11 above the pedestal 22 which has a plasma sheath or dark space separating the plasma from the pedestal and the workpiece or wafer.

The annular space 26 between the outer cover 27 and the dome 17 is exhausted using a fan mounted on the top of the cover 27. Air passages 28 are located on the lower perimeter of the cover 27 to allow air flow from the fan into the space 26 and out through the passages. A fan motor 30 powers fan blades 31 interiorly to cover 27 to ensure good circulation of air in the annular space 26.

Referring now to FIGS. 2 and 3, the gas distribution system for the reactant gas used in the system is shown in more detail schematically. The top of the metallic sidewall member 14 has a gas supply groove 33 milled therein and about 20 to about 25 evenly spaced, angularly disposed channels formed in the inner wall 14A of sidewall 14 form a plurality of gas injection holes 32 into the chamber. When the flange 18 of quartz dome 17 is placed over the sidewalls 14 of the base member 12, a closed toroidal tube is formed in the space provided by the groove 33 and capped or topped by the flange 18 of dome 17. The reactant gas, typically argon during sputtering and usually fluorine during cleaning processes, are thus supplied at about the midpoint of the chamber 11 and are uniformly distributed across the nearby workpiece or wafer. The gases are inlet through a gas inlet 19 into the gas distribution channel 33 and dispersed therein and into the chamber through gas injection holes 32.

Figure 5:
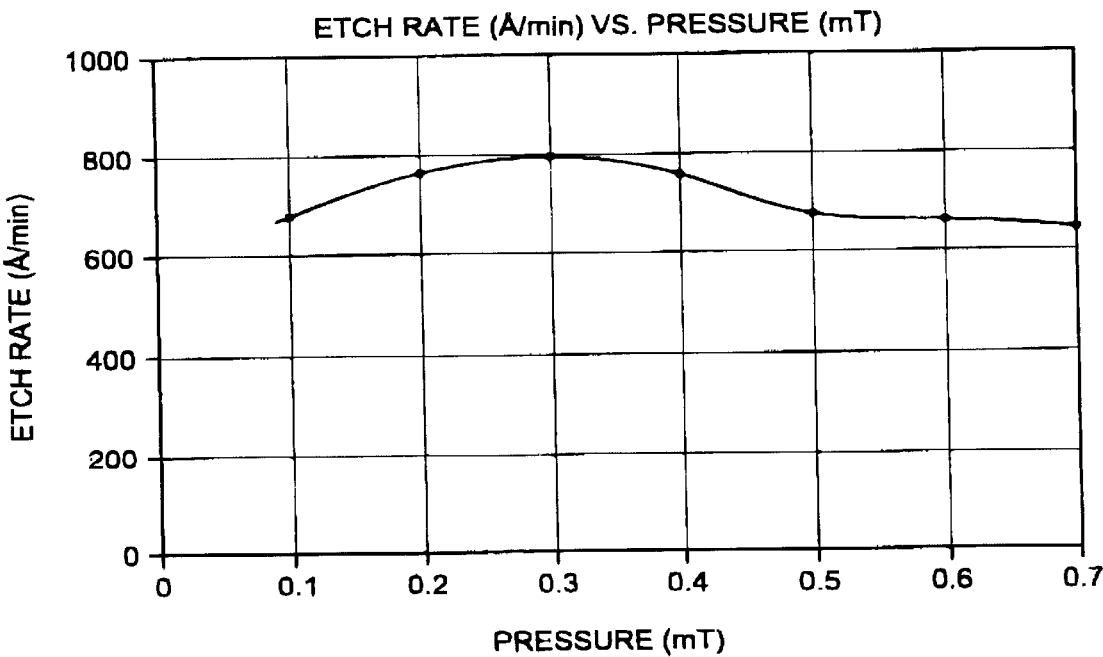
FIG. 5 is a graphical representation showing the etch rate as a function of chamber pressure for the system.

The system shown and described herein has produced unexpectedly good results in a depetch-dep process attributable to the excellent gas distribution, low capacitive coupling to the plasma of the RF driver, dome and wafer pedestal cooling and the like. For example, FIG. 4 shows graphically the etch rate 41 on a wafer as a function of bias power supplied to the cathode. Curve 42 shows similar results from a prior art chamber such as that previously discussed. The uniformity curve 43 shows excellent linearity and etch uniformity over a wide range of operating bias power settings from about 350 watts to about 700 watts. FIG. 5 shows the etch rate in Å/min as a function of chamber pressure at a bias power level of about 700 watts. In the preferred operating pressure range of about 0.5 to about 0.7 millitorr, the etch rate is remarkably stable and controllable.

While the foregoing is directed to the preferred embodiment of the present invention, other and further embodiments of the invention may be devised without departing from the basic scope thereof, and the scope thereof is determined by the claims which follow.

We claim:

1. An inductively coupled plasma system, comprising:
   (a) a body member having a base and a sidewall, the base having an opening to attach a vacuum pump thereto, the sidewall comprising a top surface having a gas supply groove connected to a gas inlet and a plurality of channels extending radially inwardly from the gas supply groove;
   (b) a plasma confinement member comprising an RF transparent material; the plasma confinement member having a circumferential flange for mating with the top surface of the sidewall;
   (c) an RF power supply coupled to an induction coil disposed around the plasma confinement member; and
   (d) a gas distribution system formed by a juncture of the flange of plasma confinement member and the top surface of the sidewall.

2. The system of claim 1 further comprising an insulated conductive pedestal located on the base of body member for holding a substrate wafer or workpiece to be processed, said pedestal being capacitively coupled to an RF bias power supply for applying a negative bias voltage to said pedestal to attract and accelerate ions from a plasma thereto.

3. The system of claim 2 further comprising a metallic top cover disposed over said plasma confinement member and said induction coil and forming an annular space therebetween.

4. The system of claim 3 further comprising means for flowing a coolant gas through the annular space between said top cover and said plasma confinement member.

5. The system of claim 4 wherein said means for flowing a coolant includes a fan.

6. The system of claim 5 further comprising means for flowing a coolant through said induction coil, said coil comprising hollow tubing.

7. The system of claim 5 further comprising means for cooling said pedestal.

8. The system of claim 1 wherein the gas supply groove comprises an annular groove machined into the top surface of the sidewall of the base member.

9. The system of claim 1 wherein the plurality of channels comprises a plurality of circumferentially spaced channels that form gas injection ports.

10. The system of claim 9 wherein the gas distribution system comprises a toroidal shaped gas distribution tube.

11. A plasma processing chamber, comprising:
   a) a base member having a sidewall and an exhaust, the sidewall comprising a top surface having a gas supply groove and a plurality of channels extending from the gas supply groove to an inner surface of the sidewall;
   b) a quartz dome having a flange that mates with the top surface of the sidewall to form a gas distribution system;
   c) a gas inlet connected to the gas supply groove;
   d) a support member for holding a workpiece in the chamber; and
   e) a plasma generator coupled to the chamber.

12. The plasma processing chamber of claim 11 wherein the plasma generator comprises:
   1) an RF induction coil disposed around the dome; and
   2) a first RF power source electrically connected to the coil.

13. The plasma processing chamber of claim 12, further comprising:

f) a second RF power source electrically connected to the support member.

14. The plasma processing chamber of claim 13, further comprising:

g) a cover enclosing the quartz dome.

15. The plasma processing chamber of claim 14, further comprising:

h) a fan disposed on the cover.

16. The plasma processing chamber of claim 13, further comprising:

g) a temperature controller connected to the support member.

17. The plasma processing chamber of claim 13, wherein the support member comprises an electrostatic chuck.

18. The plasma processing chamber of claim 13, wherein the gas distribution system is toroidal-shaped.

* * * * *

UNITED STATES PATENT AND TRADEMARK OFFICE
CERTIFICATE OF CORRECTION

PATENT NO   : 5,944,899

DATED       : August 31, 1999

INVENTOR(S) : Guo et al.

It is certified that error appears in the above-identified patent and that said Letters Patent is hereby corrected as shown below:

In Column 1, line 29, after "on", please replace "Jul" with "July".

In column 3, line 51, after "a", please replace "depetch" with "dep-etch".

Signed and Sealed this

Seventh Day of March, 2000

Attest:

Q. TODD DICKINSON

Attesting Officer

Commissioner of Patents and Trademarks